(12) United States Patent
Yao et al.

(10) Patent No.: US 6,567,436 B1
(45) Date of Patent: May 20, 2003

(54) OPTO-ELECTRONIC OSCILLATORS HAVING OPTICAL RESONATORS

(75) Inventors: Xiaotian Steve Yao, Diamond Bar, CA (US); Lutfollah Maleki, Pasadena, CA (US); Vladimir Ilchenko, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/491,988

(22) Filed: Jan. 26, 2000

Related U.S. Application Data

(60) Provisional application No. 60/117,568, filed on Jan. 27, 1999, provisional application No. 60/117,452, filed on Jan. 26, 1999, and provisional application No. 60/117,451, filed on Jan. 26, 1999.

(51) Int. Cl.[7] .............................................. H01S 3/13
(52) U.S. Cl. ........................................................ 372/32
(58) Field of Search ..................................... 372/32, 50

(56) References Cited

U.S. PATENT DOCUMENTS

| | | |
|---|---|---|
| 3,569,715 A | 3/1971 | Horning |
| 4,700,150 A | 10/1987 | Hall et al. |
| 4,796,264 A | 1/1989 | Suzuki |
| 4,829,537 A | 5/1989 | Baer |
| 5,126,876 A | 6/1992 | O'Meara |
| 5,200,964 A | 4/1993 | Huber |
| 5,212,711 A * | 5/1993 | Harvey et al. .................. 372/94 |
| 5,274,659 A * | 12/1993 | Harvey et al. .................. 372/94 |
| 5,339,324 A * | 8/1994 | Eguchi et al. ............. 372/29.022 |
| 5,343,324 A | 8/1994 | Le et al. |
| 5,379,309 A | 1/1995 | Logan, Jr. ....................... 372/18 |
| 5,400,417 A | 3/1995 | Allie et al. ....................... 385/2 |
| 5,495,359 A | 2/1996 | Gertel et al. |
| 5,532,857 A | 7/1996 | Gertel et al. |
| 5,654,818 A | 8/1997 | Yao |
| 5,723,856 A | 3/1998 | Yao et al. ................ 250/227.11 |
| 5,777,778 A | 7/1998 | Yao ............................. 359/245 |
| 5,796,501 A | 8/1998 | Yao |
| 5,917,179 A | 6/1999 | Yao |
| 5,929,430 A | 7/1999 | Yao et al. |

FOREIGN PATENT DOCUMENTS

| | | |
|---|---|---|
| WO | WO 00/44074 | 7/2000 |
| WO | WO 00/45213 | 8/2000 |

OTHER PUBLICATIONS

T.W. Hansch et al., Laser Frequency Stabilizaiton by Polarizaiton Spectroscopy of a Reflecting Reference Cavity, Optics Communications, vol. 35, No. 3, pp 441–444, Dec. 1980.

J.L. Hall et al., Laser Phase and Frequency Stabilization Using an Optical Resonator, Applied Physics B, vol. B 31, No. 2, pp. 97–105, Jun. 1983.

V.B. Braginsky et al., Quality–Factor and Nonlinear Properties of Optical Whispering–Gallery Modes, Physics Letters A, vol. 137, No. 7,8, May 29, 1989.

M.L. Gorodetsky, et al., Ultimate Q of Optical Microsphere Resonators, Optics Letters, vol. 21, pp. 453–455, No. 15, 1995.

(List continued on next page.)

Primary Examiner—Paul Ip
Assistant Examiner—Jeffrey Zahn
(74) Attorney, Agent, or Firm—Fish & Richardson P.C.

(57) ABSTRACT

Systems and techniques of incorporating an optical resonator in an optical part of a feedback loop in opto-electronic oscillators. This optical resonator provides a sufficiently long energy storage time and hence to produce an oscillation of a narrow linewidth and low phase noise. Certain mode matching conditions are required. For example, the mode spacing of the optical resonator is equal to one mode spacing, or a multiplicity of the mode spacing, of an opto-electronic feedback loop that receives a modulated optical signal and to produce an electrical oscillating signal.

37 Claims, 14 Drawing Sheets

OTHER PUBLICATIONS

Smith et al., "Mode Selection in Lasers," Proceedings of the IEEE, vol. 60, No. 4, p. 422–40, Apr. 1972.

Tracy S. Kinsel, "A Stabilized Mode–Locked Nd:YA1G Laser Using Electronic Feedback," IEEE Journal of Quantum Electronics, vol. QE–9, No. 1, p. 3–8, Jan. 1973.

Schlaak et al., "Integrated Optical Oscillators and their Applications to Optical Communication Systems," Optics Communications, vol. 36, No. 3, p. 186–8, Feb. 1, 1981.

Neyer et al., "Nonlinear Electrooptic Oscillator Using an Integrated Interferometer," Optics Communications, vol. 37, No. 3, p. 169–74, May 1, 1981.

Gibbs et al., "Periodic oscillations and chaos in optical bistability: possible guided–wave all–optical square–wave oscillators," SPIE vol. 317 Integrated Optics and Millimeter and Microwave Integrated Circuits, p. 297–304, 1981.

Neyer et al., "High–frequency electro–optic oscillator using an integrated interferometer," American Institute of Physics, Appl. Phys. Lett. 40(1), p. 6–8, Jan. 1, 1982.

Neyer et al., "Hybrid Electro–Optical Multivibrator Operating by Finite Feedback Delay," Electronics Letters, vol. 18, No. 2, p. 59–60, Jan. 21, 1982.

Neyer et al., "Dynamics of Electrooptic Bistable Devices with Delayed Feedback," IEEE Journal of Quantum Electronics, vol. QE–18, No. 12, p. 2009–2015, Dec. 1982.

Takada et al., "30 GHz Picosecond Pulse Generation from Actively Mode–Locked Erbium–Doped Fibre Laser," Electronics Letters, vol. 26, No. 3, p. 216–17, Feb. 1, 1990.

Cowle et al., "Single–Frequency Travelling–Wave Erbium–Doped Fibre Loop Laser," Electronics Letters, vol. 27, No. 3, p. 229–30, Jan. 31, 1991.

Aida et al., "Oscillation Modes of Laser Diode Pumped Hybrid Bistable System with Large Delay and Application to Dynamical Memory," IEEE Journal of Quantum Electronics, vol. 28, No. 3, p. 686–99, Mar. 1992.

Grudinin et al., "Nd : YAG Laser Pumped Picosecond $YB^{3+}/Er^{3+}$ Fibre Laser," Electronics Letters, vol. 28, No. 8, p. 766–7, Apr. 9, 1992.

Kafka, "Picosecond and Femtosecond Pulse Generation in a Regeneratively Mode–Locked Ti: Sapphire Laser," IEEE Journal of Quantum Electronics, vol. 28, No. 10, p. 2151–61, Oct. 1992.

Aida et al., "Oscillation Mode Selection Using Bifurcation of Chaotic Mode Transitions in a Nonlinear Ring Resonator," IEEE Transactions on Quantum Electronics, vol. 30, No. 12, p. 2986–97, Dec. 1992.

Harvey et al., "Harmonically mode–locked fiber ring laser with an internal Fabry–Perot stabilizer for soliton transmission," Optics Letters, vol. 18, No. 2, p. 107–9, Jan. 15, 1993.

Nagarajan et al., "Resonantly Enhanced Semiconductor Lasers for Efficient Transmission of Millimeter Wave Modulated Light," IEEE Photonics Technology Letters, vol. 5, No. 1, p. 4–6, Jan. 1993.

Sugawa et al., "1–6 ps Pulse Generation from a 1–3 $\mu$m $Pr^{3+}$– Doped Fluoride Fibre Laser," Electronics Letters, vol. 29, No. 10, p. 902–3, May 13, 1993.

Yao et al., "High Frequency Optical Subcarrier Generator," Electronics Letters, vol. 30, No. 18, p. 1525–6, Sep. 1, 1994.

Nakazawa et al., "Ultrastable harmonically and regeneratively modelocked polarization–maintaining erbium fibre ring laser," Electronics Letters, vol. 30, No. 19, p. 1603–5, Sep. 15, 1994.

Tiemeijer et al., "27–dB Gain Unidirectional 1300–nm Polarization–Insensitive Multiple Quantum Well Laser Amplifier Module," IEEE Photonics Technology Letters, vol. 6, No. 12, p. 1430–2, Dec. 1994.

Yoshida et al., "20 GHz, 1.8ps pulse generation from a regeneratively modelocked erbium–doped fibre laser and its femtosecond pulse compression," Electronics Letters, vol. 31, No. 5, p. 377–8, Mar. 2, 1995.

Yao et al., "A High–Speed Photonic Clock and Carrier Regenerator," TDA Progress Report 42–121, p. 202–10, May 15, 1995.

Yao et al., "Light Induced Microwave Oscillator," Jet Propulsion Laboratory, California Institute of Technology, 4800 Oak Grove Dr., Pasadena, CA 91109, Submitted to JOSA–B on Oct. 12, 1995.

Yao et al., "A High Speed Photonic Clock and Carrier Recovery Device," Jet Propulsion Laboratory, California Institute of Technology, 4800 Oak Grove Dr., Pasadena, CA 91109, Submitted to IEEE Photonics Technology Letters on Oct. 30, 1995.

Griffel et al., "Fiber Coupling of DFB Laser to Micro Spherical Cavities—A Novel Approach for Frequency Control and Linewidth Quenching Utilizing Morphology Dependent Resonances," IEEE $8^{th}$ Annual Meeting Conference Proceedings, Lasers and Electro–Optics Society Annual Meeting, vol. 1, p. 296–7, Oct. 1995.

Yao et al., "Converting light into spectrally pure microwave oscillation," Optics Letters, vol. 21, No. 7, p. 483–5, Apr. 1, 1996.

Nakazawa et al., "Direct generation of a 750fs, 10GHz pulse train from a regeneratively mode–locked fibre laser with multiple harmonic modulation," Electronics Letters, vol. 32, No. 14, p. 1291–3, Jul. 4, 1996.

Yao et al., "Light–Induced Microwave Oscillator for Photonic Systems," IEEE Journal of Quantum Electronics, vol. 32, No. 7, p. 1–10, Jul. 1996.

Yao et al., "Optoelectronic Oscillator for Photonic Systems," IEEE Journal of Quantum Electronics, vol. 32, No. 7, p 1141–9, Jul. 1996.

Yao et al., "Optoelectronic microwave oscillator," J. Opt. Soc. Am. B, vol. 13, No. 8, p. 1725–35, Aug. 1996.

Little et al., "Analytic Theory of Coupling from Tapered Fibers and Half–Blocks into Microsphere Resonators," Journal of Lightwave Technology, vol. 17, No. 4, p. 704–15, Apr. 1999.

Wang et al., "A Whispering Gallery Mode Sapphire Resonator with Semi–Spherical Enclosure," 2000 IEEE MTT–S International, Microwave Symposium Digest, vol. 2, p. 1149–52, Jun. 2000.

* cited by examiner

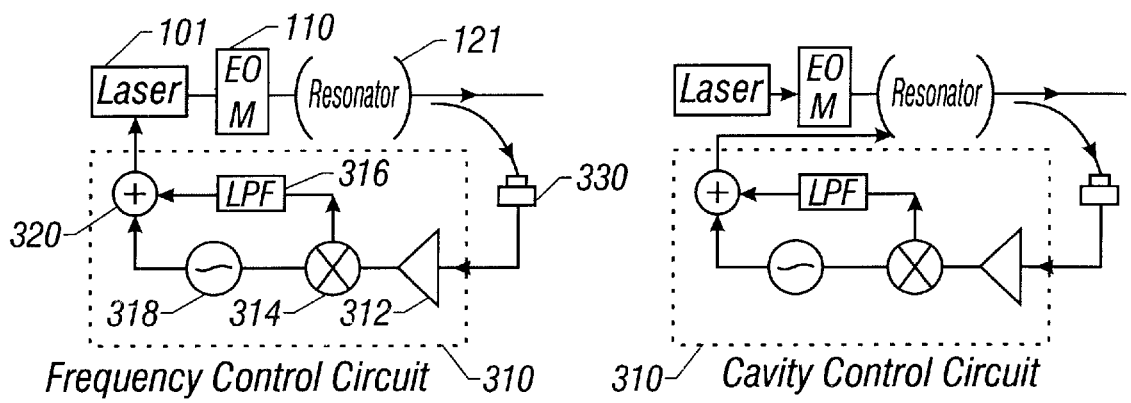
FIG. 3A  FIG. 3B
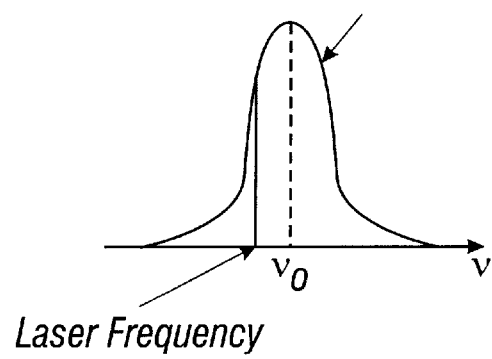
FIG. 4A
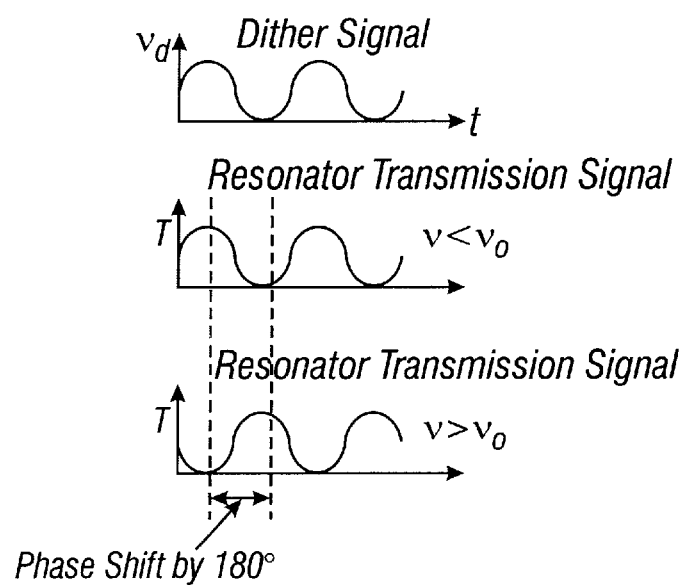
FIG. 4B

OPTO-ELECTRONIC OSCILLATORS HAVING OPTICAL RESONATORS

This application claims the benefits of U.S. Provisional Application Nos. 60/117,568 filed on Jan. 27, 1999, Ser. No. 60/117,452 filed on Jan. 26, 1999, and Ser. No. 60/117,451 filed on Jan. 26, 1999.

ORIGIN OF THE DISCLOSURE

The systems and techniques described herein were made in the performance of work under a NASA contract, and are subject to the provisions of Public Law 96-517 (35 USC 202) in which-the Contractor has elected to retain title.

BACKGROUND

This application relates to methods and devices for generation of oscillating signals, and more specifically, to generation of oscillating signals by using opto-electronic oscillators.

Oscillating signals can be generated by using various types of oscillators having energy storage elements. The quality factor Q, or the energy storage time, of an energy storage element can determine the spectral linewidth of the respective oscillating signal. Increasing the quality factor Q or the energy storage time can reduce the spectral linewidth of the oscillating signal and hence improve the signal's spectral purity.

Spectrally pure radio frequency (RF) oscillators can be used for generating, tracking, cleaning, amplifying, and distributing RF carriers. Such RF carriers can have important applications in communication, broadcasting, and receiving systems in the radio frequency spectral range. In particular, voltage-controlled RF oscillators with phase-locked loops can be used for, among others, clock recovery, carrier recovery, signal modulation and demodulation, and frequency synthesizing.

RF oscillators can be constructed by using both electronic and optical components to form opto-electronic oscillators ("OEOs"). See, e.g., U.S. Pat. Nos. 5,723,856 to Yao and Maleki and U.S. Pat. No. 5,777,778 to Yao. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillation in radio frequency spectrum when the total loop gain of the active opto-electronic loop and any other additional feedback loops exceeds the total loss.

OEOs use optical modulation to produce oscillations in frequency spectral ranges that are outside the optical spectrum, such as in RF and microwave frequencies. The generated oscillating signals are tunable in frequencies and can have narrow spectral linewidths and low phase noise in comparison with the signals produced by other RF and microwaves oscillators. Notably, the OEOs are optical and electronic hybrid devices and thus can be used in optical communication devices and systems.

A variety of OEOs can be constructed based on the above principles to achieve certain operating characteristics and advantages. For example, another type of OEOs is coupled opto-electronic oscillators ("COEOs") described in U.S. Pat. No. 5,929,430 to Yao and Maleki. Such a COEO directly couples a laser oscillation in an optical feedback loop to an electrical oscillation in an opto-electronic feedback loop. Opto-electronic oscillators can also be implemented by having at least one active opto-electronic feedback loop that generates an electrical modulation signal based on the stimulated Brillouin scattering. U.S. Pat. No. 5,917,179 to Yao. Such a Brillouin OEO includes a Brillouin optical medium in the feedback loop and uses the natural narrow linewidth of the Brillouin scattering to select a single oscillating mode.

SUMMARY

The present disclosure includes opto-electronic oscillators that implement at least one high-Q optical resonator in an electrically controllable feedback loop. An electro-optical modulator is provided to modulate an optical signal in response to at least one electrical control signal. At least one opto-electronic feedback loop, having an optical part and an electrical part, is coupled to the electro-optical modulator to produce the electrical control signal as a positive feedback. The electrical part of the feedback loop converts a portion of the modulated optical signal that is coupled to the optical part of the feedback loop into an electrical signal and feeds at least a portion of it as the electrical control signal to the electro-optical modulator.

The high-Q optical resonator may be disposed in the optical part of the opto-electronic feedback loop or in another optical feedback loop coupled to the opto-electronic feedback loop, to provide a sufficiently long energy storage time and hence to produce an oscillation of a narrow linewidth and low phase noise. The mode spacing of the optical resonator is equal to one mode spacing, or a multiplicity of the mode spacing, of the opto-electronic feedback loop. In addition, the oscillating frequency of the OEO is equal to one mode spacing or a multiple of the mode spacing of the optical resonator.

The optical resonator may be implemented in a number of configurations, including, e.g., a Fabry-Perot resonator, a fiber ring resonator, and a microsphere resonator operating in whispering-gallery modes. These and other optical resonator configurations can reduce the physical size of the OEOs and allow integration of an OEO with other photonic devices and components in a compact package such as a single semiconductor chip.

These and other aspects and associated advantages will become more apparent in light of the detailed description, the accompanying drawings, and the appended claims.

BRIEF DESCRIPTION OF THE DRAWINGS

FIGS. 3A and 3B show implementations of the active control of the relative frequency between the laser and the resonator in the oscillator shown in FIG. 1.

FIGS. 4A and 4B illustrate the operation of the frequency control circuit based on the error signal produced from dithering the laser or the resonator.

DETAILED DESCRIPTION

An optical resonator of a high Q factor, when incorporated into an optical section of an opto-electronic oscillator as an energy storage element, can produce a number of effects in the oscillator. First, when intended as an energy storage element, the optical resonator can effectuate, an increase in the energy storage time of the oscillator and hence reduce the spectral linewidth and the phase noise of the opto-electronic oscillation.

Second, the optical resonator generates its own resonator modes in the oscillator, in addition to the modes caused by other feedback loops. This requires certain mode matching between the resonator modes and other modes in the oscillator so as to properly operate the overall opto-electronic oscillator.

Third, when the optical resonator is configured to have a mode spacing greater than another mode spacing in the oscillator, the mode matching conditions force the mode spacing of the opto-electronic oscillation to be the mode spacing of the resonator. Hence, the cavity length of the resonator can be made so small that the mode spacing of the oscillation is sufficiently large to allow an easy selection of a single mode for oscillation by electrical filtering.

The following illustrates examples of opto-electronic oscillators of different configurations that implement an optical resonator and their respective mode matching conditions.

Figure 1:
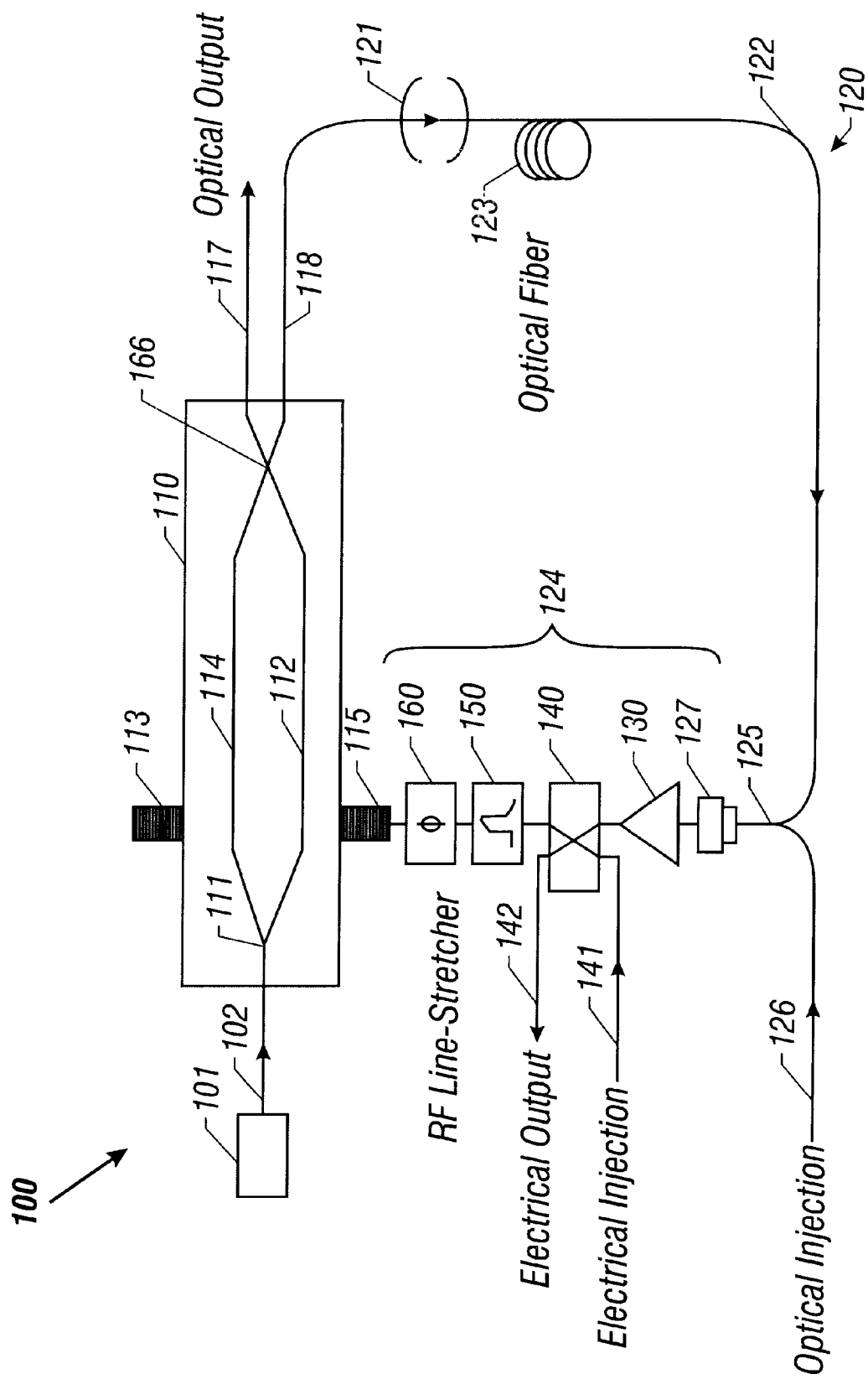
FIG. 1 shows one embodiment of a single-loop opto-electronic oscillator having an optical resonator according to the invention.

FIG. 1 shows one embodiment 100 of a single-loop opto-electronic oscillator with an optical resonator 121. This and other devices based on a single opto-electronic loop, without the optical resonator, are described in U.S. Pat. No. 5,723,856 to Yao, which is incorporated by reference in its entirety. The OEO includes a light source 101, an electro-optic ("EO") modulator 110, and an opto-electronic feedback loop 120 coupled to the EO modulator 110. A light beam 102 from the light source 101 is coupled into the EO modulator 110 and is modulated in response to a feedback signal from the feedback loop 120 that is applied to a driving port 115.

In the EO modulator 110, an input optical coupler 111 splits the beam 102 into two channels 112 and 114 which undergo different phase or polarization modulation. A bias port 113 is used to apply an electrical bias to offset the modulation via an external source. The light modulation is controlled by both the electrical voltage bias at the bias port 113 and the feedback voltage at the driving port 115. The latter causes the light modulation to oscillate at a desired frequency such as a RF frequency. An output optical coupler 116 recombines the light from the modulated two channels 112 and 114 to produce a RF modulated light signal through coherent interference. The output coupler 116 sends one portion of the coupled output of the modulator 110 as an optical output 117 and another portion as a feedback 118 into the opto-electronic feedback loop 120. The opto-electronic feedback loop 120 and the EO modulator 110 forms a closed loop to support the opto- electronic oscillation.

The opto-electronic feedback loop 120 generally includes an optical part 122 and an electrical part 124 that is coupled to the optical part 122. A photodetector 127 interconnects the optical part 122 and the electrical part 124 by converting the optical signal into an electrical signal. An optical coupler 125 may be used to couple an external optical signal 126 into the output of the optical part 122 so that the total sum of the optical signal from the optical part 122 and the external signal 126 is measured by the photodetector 127.

The optical part 122 includes the optical resonator 121 and an optical waveguiding element 123 such as optical fiber. The optical waveguiding element 123 couples the output 118 to the resonator 121 and guides the output of the resonator 121 to the photodetector 127. The optical resonator 121 is configured to have a high Q factor to cause the longest delay in the OEO 100. The oscillator 100 is configured so that the modes of the resonator 121, the oscillation frequency of the oscillator 100, and the modes of the feedback loop 120 must have desired mode matching relationships with one another in order to sustain the opto-electronic oscillation when the loop gain in the closed loop formed by the loop 120 and the EO modulator 110 is greater than unity.

The length of the optical waveguiding element 123 may be configured to cause a desired delay in addition to the delay caused by the optical resonator 121. The delay in the optical part 122 may be adjusted by, e.g., changing the cavity length of the resonator 121. In addition, the length of the optical waveguiding element 123 can be changed to alter the delay in the optical part 122. A fiber stretcher may be used to achieve this.

The electrical part 124 of the opto-electronic feedback loop 120 includes an electrical amplifier 130 and an electrical signal band-pass filter to select a desired spectral component in the part 124 as the feedback driving signal to the port 115. In addition, an electrical signal coupler 140 may be provided in the part 124 to inject an external electrical signal 141 and to produce an electrical output 142. Moreover, a variable electrical delay 160 may be used in the part 124 to change signal delay in the part 124 and hence the total delay in the feedback loop 120.

The feedback from the opto-electronic feedback loop 120 to the OE modulator 110 is positive in order to produce an oscillation. This can be achieved by controlling the total delay or phase shift of the feedback loop 120. The total gain in the closed loop formed by the feedback loop 120 and the OE modulator 110 is greater than unity, i.e., the gain exceeding losses for the circulating waves in the loop. The loop gain can be controlled and maintained by using the electrical amplifier 130, the injected signal 126 or 141, or a combination of the above. Notably, both electrical signal and the optical signal in the oscillator 100 are in the feedback loop 120 and hence are inherently interconnected. If either signal changes, the other also changes.

In general, many modes can oscillate simultaneously in the single-loop OEO 100. The filter 150 such as a RF filter is used to achieve a single mode oscillation by suppressing other oscillation modes. The filter 150 can also be used for coarse tuning the oscillation frequency. Frequency tuning can also be achieved by biasing at the bias port 113 and the voltage input at the RF driving port 112. The delay in the optical part 122 can be used to control and finely tune the oscillation frequency. The phase noise in this single-loop OEO can be significantly reduced as the total delay in the feedback loop 120 increases.

The cavity length of the optical resonator 121 is set to have a free spectral range, i.e. the spacing between two adjacent cavity modes, that is greater than the mode spacing of the modes of the opto-electronic loop formed by the loop 120 and the OE modulator 110 including the contribution from the resonator 121. Hence, the mode spacing of the OEO 100 is primarily determined by the mode spacing of the resonator 121. The cavity length of the resonator 121 can be set sufficiently small so that the resonator mode spacing is generally sufficiently large for the bandpass filter 150 to filter out unwanted modes and makes the oscillator 100 operate in single mode. The large mode spacing provided by the optical resonator 121 is also advantageous for radar and other applications because the unwanted residual side modes, if still exist, can be filtered out externally.

Certain mode matching conditions for the OEO 100 must be satisfied in order to sustain an oscillation with a loop gain greater than the losses. A mode that fails to meet the mode matching conditions is subject to significant loss caused by the spectral profiles of the permissible natural opto-electronic oscillation modes and the permissible resonator modes in additional to other losses in the closed opto-electronic loop formed by the feedback loop 120 and the OE modulator 110.

The mode matching conditions include: (1) the laser center frequency $v_{laser}$ of the input beam 102 from the laser 101 are within one of the transmission peaks of the optical resonator 121 so that enough light can reach the photodetector to assure the open loop gain of the opto-electronic loop greater than unity, i.e., $$v_{laser} = M \cdot FSR_r,$$

where M is a positive integer and $FSR_r$ is the free spectral range of the optical resonator 121; (2) the free spectral range, $FSR_r$, of the optical resonator is equal to one or a multiplicity of the mode spacing, $\Delta v_{OE\ Loop}$, of the natural modes in the opto-electronic loop, i.e., $$FSR_r = N \cdot \Delta v_{OE\ Loop},$$

where N is a positive integer (1, 2, 3, ... ); and (3) the frequency $\Delta v_{OEO}$ of the opto-electronic oscillation of the OEO 100 equals to the multiples of the free spectral range $FSR_r$ of the resonator 121:

$$v_{OEO} = K \cdot FSR_r,$$

where K is also a positive integer (1, 2, 3, ... ).

Figure 2A:
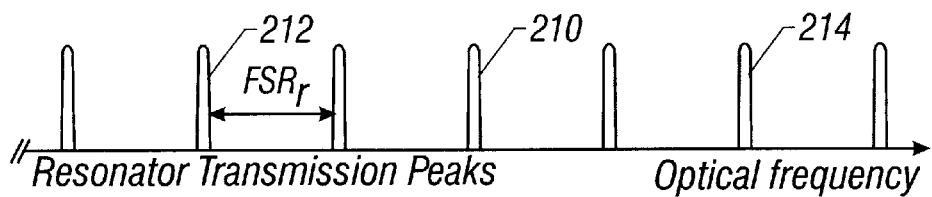
FIGS. 2A, 2B, 2C, and 2D illustrate mode matching conditions for the oscillator shown in FIG. 1.
Figure 2B:
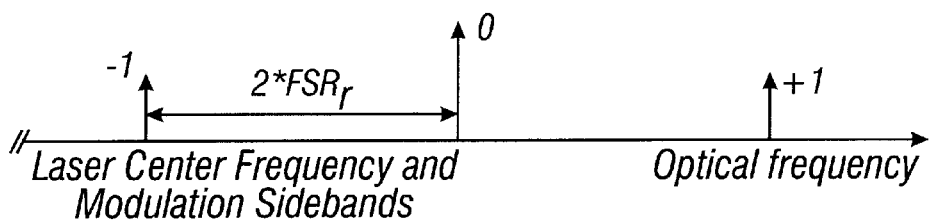
Figure 2C:
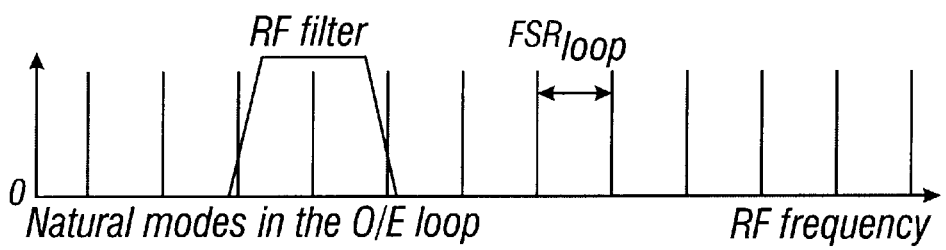
Figure 2D:

FIGS. 2A, 2B, 2C, and 2D illustrate the above mode matching conditions. FIG. 2A shows the permissible resonator modes of the optical resonator 121 in the optical frequency range. In the same frequency scale as in FIG. 2A, FIG. 2B shows the position of the laser frequency $v_{laser}$ of the input beam 102 for the EO modulator 110 to be resonant or overlap with one of the resonator modes in FIG. 2A under the mode matching condition (1). FIG. 2C shows the natural modes of the opto-electronic loop in a frequency range of the opto-electronic oscillation (e.g., the RF frequency range) of the OEO 100 under the mode matching condition (2) where N=2. FIG. 2D shows the opto-electronic oscillation frequency $v_{OEO}$ is given by $2FSR_r(K=2)$ under the mode matching condition (3).

The EO modulator 110 modulates the input beam 102 to produce one or more modulation side bands. FIG. 2B shows the first two orders of sidebands. Because of the mode matching condition (3), each modulation sideband is in resonance with a resonator mode. Hence, the +1 sideband overlaps with a resonator mode 214 and the −1 sideband overlaps with resonator mode 212 when the laser center frequency overlaps with the resonator mode 210. This automatically assures that the optical sidebands generated by the modulator pass through the resonator with minimum loss.

When the above three mode matching conditions are satisfied, the mode spacing of the OEO 100 becomes the free spectral range $FSR_r$ of the resonator 121. For single mode selection, the bandpass filter 150 with a bandwidth less than the free spectral range $FSR_r$ of the resonator 121 can be used, as shown in FIG. 2C. In certain implementations, $FSR_r$ of the resonator 121 can be configured to be much greater than the mode spacing $\Delta v_{OE\ Loop}$ of the opto-electronic oscillation, e.g., about 100 times of that of a fiber delay line based OEO (on the order 10 MHz or larger). Therefore, unlike in a single-loop OEO without the optical resonator 121, the bandwidth of the RF filter 150 is not required to be narrow, e.g., bandwidth on the order of hundreds of KHz at a carrier frequency on the order of 10 GHz which is difficult to achieve. Rather, the bandwidth of the filter 150 can be on the order of 10 MHz or greater and such RF filters are available. Thus, the implementation of the optical resonator 121 in the single-loop OEO 100 not only increases the total delay in the loop 120 to reduce the phase noise but also provides a frequency selecting mechanism to ensure a single mode operation.

In practical applications, fluctuations of the environmental conditions and aging of the device components, such as variations in temperature, stress, or other type disturbances, can cause changes in both the laser frequency $v_{laser}$ from the laser 101 and the transmission peak frequencies of the resonator 121. Therefore, the relative value of the laser frequency $v_{laser}$ and a respective resonant transmission peak of the resonator 121 can change over time in absence of a control mechanism. Such a change, when exceeding a range, can destroy the mode matching condition (1) and hence cause a malfunction of the OEO 100 of FIG. 1.

Therefore, it is desirable to control the difference between the laser frequency $v_{laser}$ and a respective transmission peak of the resonator 121 to maintain the mode matching condition (1). This can be achieved by either actively locking the frequency $v_{laser}$ of the laser 101 to the respective transmission peak of the resonator 121, or alternatively, actively locking the resonator 121 to the laser 101. The choice of these two frequency locking techniques depend on which one is more environmentally stable in a specific application. In both active locking techniques, a monitoring mechanism is used to monitor the difference between the laser frequency $v_{laser}$ and the respective transmission peak of the resonator 121 to generate an error signal. Then, in response to this error signal, a frequency correcting mechanism is used to reduce the frequency difference to a value with a tolerable difference range.

FIGS. 3A and 3B show two implementations of the active control of the relative frequency between the laser 101 and the resonator 121. Both implementations use a frequency control circuit 310 which detects the frequency difference and applies a control signal either to the laser 101 or to the cavity of the resonator 121. The input of the circuit 310 is coupled to receive an electrical signal converted from the optical output of the optical resonator 121. A designated photodetector 330 may be used to produce the input to the circuit 310. Alternatively, this input can be obtained from the output of the photodetector 127 that interconnects the two parts 120 and 124 of the feedback loop 120 of the OEO 100 in FIG. 1.

One embodiment of the frequency control circuit 310 includes a signal phase detector 314, a low-pass filter 316, a dithering signal generator 318, and a signal adder 320. A signal amplifier 312 may be used to amplify the input signal to the phase detector 314. The dither 318 produces a sinusoidal dither of a frequency $f_d$ and is coupled to provide the same dither signal to both the adder 320 and the phase detector 314. In operation, the phase detector 314 compares the phase of the dither signal to that of the output from the resonator 121 to produce a first error signal. After being filtered by the low-pass filter 316, the first error signal and the dither signal are added to form a second error signal that is fed to either the laser 101 as shown in FIG. 3A or the resonator 121 as shown in FIG. 3B to reduce the frequency difference.

FIGS. 4A and 4B illustrate the operation of the frequency control circuit 310 based on the error signal produced from dithering the laser 101 or the resonator 121. FIG. 4A shows the transmission spectral peak of the resonator 121 in a relationship with the laser frequency. When the laser center frequency $v_{laser}$ is aligned with the desired transmission peak of the resonator 121, the detected signal is zero at $f_d$ and maximum at $2f_d$. If the laser frequency $v_{laser}$ is on the left side of the transmission peak ($v<v_o$), the detected error signal at $f_d$ is non-zero and is in phase with the applied dithering control signal. On the other hand, when the laser frequency is at right of the transmission peak ($v>v_o$), the detected error signal at $f_d$ will have an opposite phase with that of the applied dithering control signal. By using a phase sensitive detection scheme by the operations of the phase detector 314 and the adder 320 to produce a phase sensitive error signal, the relative frequency of the laser 101 and the resonator 121 can be actively locked within a desired range to maintain the mode matching condition (1).

Other active frequency locking methods can also be used. For example, one alternative technique is described by R. Drever et al. in "Laser phase and frequency stabilization using an optical cavity," Applied Physics B, Vol. 31, pp. 97–105 (1983). Another alternative technique is described by and Hansch and Couillaud in "Laser frequency stabilization by polarization spectroscopy of a reference cavity," Optics Communications, Vol. 35, pp. 441–444 (1980).

Figure 5:
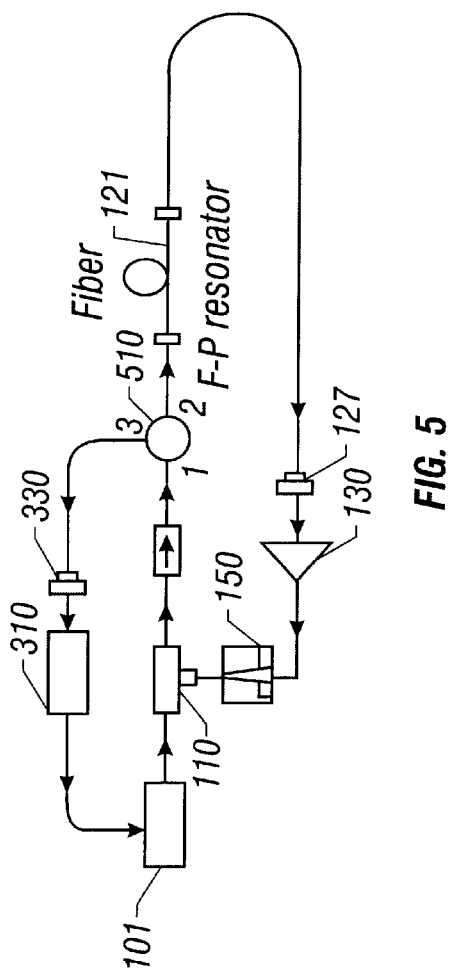
FIG. 5 shows an implementation of the frequency control circuit that receives its input from an optical signal reflected by an optical resonator in an opto-electronic oscillator.

In an alternative implementation, the input to the frequency control circuit 310 may be converted from an optical signal reflected from the resonator 121. FIG. 5 shows this configuration. An optical circulator or a beam splitter 510 can be disposed between the EO modulator 110 and the resonator 121 to direct the reflected optical signal to the photodetector 330.

The optical resonator 121 can be implemented in different configurations to operate as the optical energy storage component. For example, fiber Fabry-Perot resonators, fiber ring resonators, optical microsphere resonators, and other microresonators can be used to construct an OEO. The use of optical resonators can significantly reduce the size of the OEO due to their high Q factors. In particular, the optical microsphere resonator and other types of micro resonators can be used to integrate an OEO on a chip.

Figure 6:
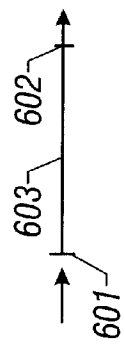
FIGS. 6, 7, 8A, and 8B show examples of the optical resonator that can be used in an opto-electronic oscillator according to the invention.

A compact and light weight Fabry-Perot resonator can be constructed by forming highly reflective coatings 601 and 602 on two ends of a segment of optical fiber 603 to form a fiber Fabry-Perot resonator. FIG. 6 shows such a fiber Fabry-Perot resonator. An alternative way to make a fiber Fabry-Perot resonator is to form fiber Bragg gratings at or near both ends to replace the reflective coatings 601 and 602. Light coupling into the resonator bounces back and forth inside the resonator before exiting so that the effective energy storage time dramatically increases. For a RF signal on an optical carrier, the effective energy storage time $\tau_{eff}$ of the fiber Fabry-Perot resonator is $$\tau_{eff}=\tau_d \cdot (1+R)/(1-R),$$

where R is the reflectivity of the coatings and $\tau_d$ is the fiber transmission delay. The free spectral range is:

$$FSR_r = \frac{c}{2n_{eff}L_r},$$

where c is the speed of light in vacuum, $n_{eff}$ is the effective index of the resonator, and $L_r$ is the length of the resonator.

For a reasonable reflectivity of R=0.99, $\tau_{eff}$=199 $\tau_d$. Hence, for a given fiber length, the effective delay time is increased by 199 times, or for a given required energy storage time $\tau_{eef}$, the required the fiber length is reduced by 199 times. With proper reflective coatings, a fiber Fabry-Perot resonators with a 20-meter long fiber can be used to have an effective delay time equivalent to a delay by a 3-km long fiber.

Figure 7:
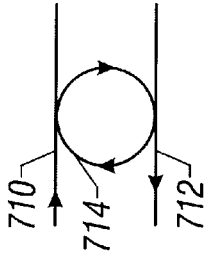

Another configuration for the optical resonator 121 is a fiber ring resonator shown in FIG. 7. Such a ring resonator can be fabricated by coupling two fiber directional couplers 710 and 712 to a fiber ring 714. Light coupled into the fiber ring 714 circulates in the ring 714 many times before exiting. The resulting effective energy storage time depends on the coupling ratios and excess losses of the couplers 710 and 712. The free spectral range for the ring resonator is given by:

$$FSR_r = \frac{c}{n_{eff}L_r},$$

where $L_r$ is the circumference of the ring 714. FIGS. 7A and 7B show two exemplary single-loop oscillators based on the fiber ring resonator.

Figure 8B:
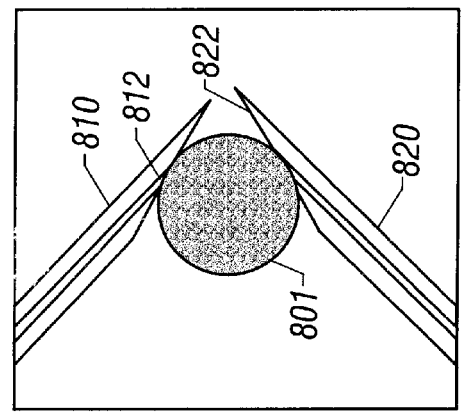
Figure 8A:
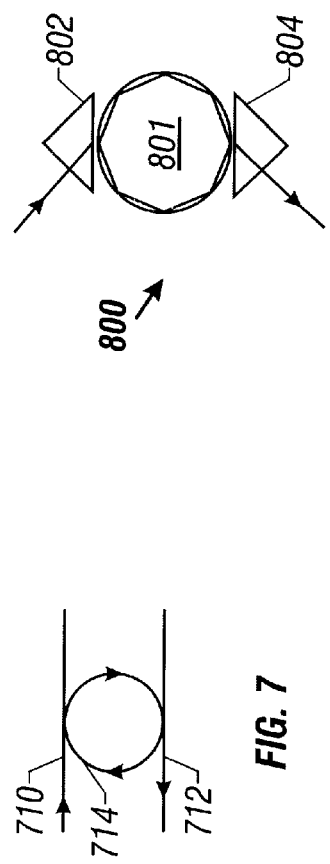

FIG. 8A shows a micro whispering-gallery-mode resonator 800 with even smaller size and weight than the above resonators. This resonator 800 includes a transparent micro sphere, a ring, or a disk 801 as the cavity and two optical couplers 802 and 804. Quality-factor of such resonators is limited by optical attenuation in the material and scattering on surface inhomogeneities, and can be as high as $10^4$–$10^5$ in microrings and disks, and up to $10^{10}$ in microspheres. See, e.g., Suzuki et al., IEEE Photon. Technol. Lett., Vol. 4, pp.1256–1258 (1992); Little et al., J. Lightwave Technol., Vol.15, pp.998–1005 (1997); Braginsky et al., Phys.Lett. A, v.137, pp.393–397 (1989); and Gorodetsky et al., Opt. Lett., vol.21, pp.453–455 (1996). The material for the cavity 801 may be a variety of dielectric materials, including fused silica which is a low loss material for optical fibers. Each coupler may be a prism or in other forms.

Light is coupled into and out of the micro resonator 800 in whispering-gallery modes through the evanescent fields at the surface of the sphere 801 that decays exponentially outside the sphere 801. Once coupled into the sphere 801, the light undergoes total internal reflections at the surface of the sphere 801 in a similar fashion as light propagating in an optical fiber. The effective optical path length is increased by such circulation, just like in a fiber ring resonator.

It is predicted that the effective path length of a micro resonator of a few hundreds of microns in diameter operating at 1550 nm can be as long as 10 km, limited by the intrinsic attenuation of the material. It has also been shown that high-Q microspheres can effectively replace fiber-optic delays in the OEO with a length up to 25 km, which corresponds to a Q factor of 19 million at 30 GHz. Such a high Q resonator can be used to achieve a phase noise of less than −60 dB at 1 Hz away from a 30 GHz carrier in an OEO to meet the requirement of deep space Ka band communication.

FIG. 8B shows an alternative microsphere resonator 810 using two fibers 810 and 820 as the couplers. The end surfaces of both fiber couplers 810 and 820 are cut at a desired angle and are polished to form micro-prisms. The two fiber couplers 810 and 820 may be implemented by using two waveguides formed in a substrate which can be used to integrate the OEO on a single chip.

The whispering-gallery-mode resonators shown in FIGS. 8A and 8B can be used to form a special compact OEO integrated to a substrate, in addition to their functions as an optical resonator in an OEO. In particular, when properly configured, the opto-electronic feedback loop can be simplified, e.g., by eliminating the electrical amplifier 130 shown in the OEO 100 of FIG. 1.

Figure 9:
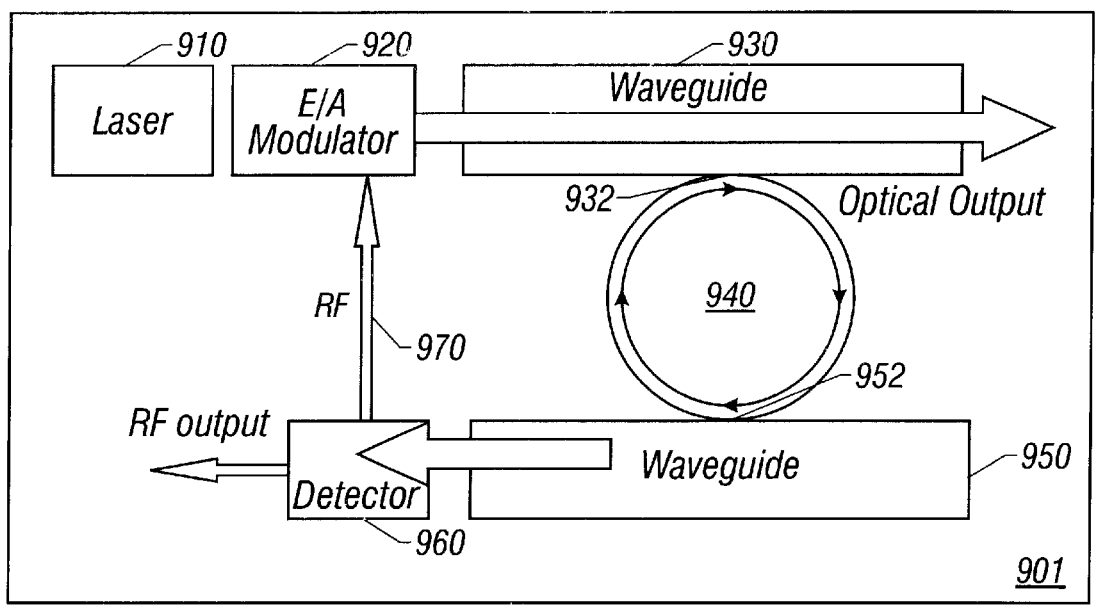
FIG. 9 illustrates an embodiment of an integrated opto-electronic oscillator with all its components fabricated on a semiconductor substrate according to the invention.

FIG. 9 illustrates an embodiment of an integrated OEO 900 with all its components fabricated on a semiconductor substrate 901. The integrated OEO 900 includes a semiconductor laser 910, a semiconductor electro-absorption modulator 920, a first waveguide 930, a micro resonator 940 in whispering gallery modes, a second waveguide 950, and a photodetector 960. An electrical link 970, e.g., a conductive path, is also formed on the substrate 901 to electrically couple the detector 960 to the modulator 920. The micro resonator 940 can be a microsphere, a micro disk, or a ring and operates in the whispering-gallery modes. It is used as a high-Q energy storage element to achieve low phase noise and micro size. A RF filter may be disposed in the link 970 to ensure a single-mode oscillation. In absence of such a filter, a frequency filtering effect can be achieved by narrow band impedance matching between the modulator 920 and the detector 960.

Both waveguides 930 and 950 have coupling regions 932 and 952, respectively, to provide proper optical coupling at two different locations in the micro resonator 940. The first waveguide 930 has one end coupled to the modulator 920 to receive the modulated optical output and another end to provide an optical output of the OEO 900. The second waveguide 950 couples the optical energy from the micro resonator 940 and delivers the energy to the detector 960.

The complete closed opto-electronic loop is formed by the modulator 920, the first waveguide 930, the micro resonator 940, the second waveguide 950, the detector 960, and the electrical link 970. The phase delay in the closed loop is set so that the feedback signal from the detector 960 to the modulator 920 is positive. In addition, the total open loop gain exceeds the total losses to sustain an opto-electronic oscillation. The previously described mode matching conditions are also required.

In general, an electrical signal amplifier can be connected between the detector 960.and the modulator 920. Photodetectors and modulators are usually terminated with a 50-ohm impedance to match that of the transmission line or other microwave components, although the intrinsic impedance of the detector 960 and modulator 920 are high, e.g., around a few kilo-ohms. Consequently, the generated photovoltage by the photodetector 960, which equals to its photocurrent multiplied by 50 ohm, is too low to efficiently drive the modulator 920. Thus, it is becomes necessary to use a signal amplifier in the link 970 in order to properly drive the modulator 920.

However, such a high-power element can be undesirable in a highly integrated on-chip design such as the OEO 900. For example, the high power of the amplifier may cause problems due to its high thermal dissipation. Also, the amplifier can introduce noise or distortion, and may even interfere operations of other electronic components on the chip.

One distinctive feature of the OEO 900 is to eliminate such a signal amplifier in the link 970 by matching the impedance between the electro-absorption modulator 920 and the photodetector 960 at a high impedance value. The desired matched impedance is a value so that the photovoltage transmitted to the modulator 920, without amplification, is sufficiently high to properly drive the modulator 920. In certain systems, for example, this matched impedance is at about 1 kilo ohm or several kilo ohms. The electrical link 970 is used, without a signal amplifier, to directly connect the photodetector 960 and the modulator 920 to preserve their high impedance. Such a direct electrical link 970 also ensures the maximum energy transfer between the two devices 920 and 960. For example, a pair of a detector and a modulator that are matched at 1000 ohm has a voltage gain of 20 times that of the same pair that are matched at 50 ohm.

The previously-described frequency control circuit 310 shown in FIGS. 3A, 3B, and 3C may be similarly implemented in the OEO 900 of FIG. 9 to maintain the mode matching condition (1). To adjust the cavity length of the micro resonator 940, the output signal of the circuit 310 may be used to cause a mechanical squeeze on the resonator 940, e.g., through a piezo-electric transducer.

The above implementations of an optical resonator and a frequency control circuit in a single-loop OEO can be used in OEOs in other configurations to reduce phase noise in opto-electronic oscillations under proper mode matching conditions. These other OEOs include, but are not limited to, multi-loop OEOs, Brillouin OEOs, and coupled OEOs. The following are some exemplary implementations in these different OEOs.

Multi-loop OEOs use at least one fiber loop in one opto-electronic feedback loop of at least two feedback loops as an energy storage element. Such devices are disclosed in the U.S. Pat. No. 5,777,778 to Yao, which is incorporated herein by reference in its entirety. The different feedback loops have different delays. The opto-electronic feedback loop with the longest delay is used to achieve low phase noise and narrow spectral linewidth. This loop is also used to provide fine frequency tuning since its mode spacing is smaller than any of the other feedback loops. On the other hand, the feedback loop with the shortest delay and the widest mode spacing, either opto-electronic or purely electronic, is used to provide a coarse frequency tuning to achieve a wide continuous tuning range. The total open loop gain of the multiple loops must exceed the total losses to sustain an opto-electronic oscillation but each loop may have an open loop gain less then the loss in that loop.

One embodiment of the present invention is to place the optical resonator 121 of the OEO 100 in FIG. 1 into an optical section of an opto-electronic loop in a multi-loop OEO as suggested by the U.S. Pat. No. 5,777,778 to further reduce the phase noise and the spectral linewidth of the opto-electronic oscillation. This optical resonator 121 may be placed in the opto-electronic loop with the longest delay to reduce the amount of the fiber, the physical size, and cost of the OEO. In addition to satisfy the previously described three mode matching conditions, an oscillating mode must be in resonance with one mode in each feedback loop, i.e., one mode of each loop must overlap one mode from each and every of other loops. The frequency control circuit 310 shown in FIGS. 3A, 3B, and 3C may be similarly implemented to maintain the mode matching condition (1).

Figure 10A:
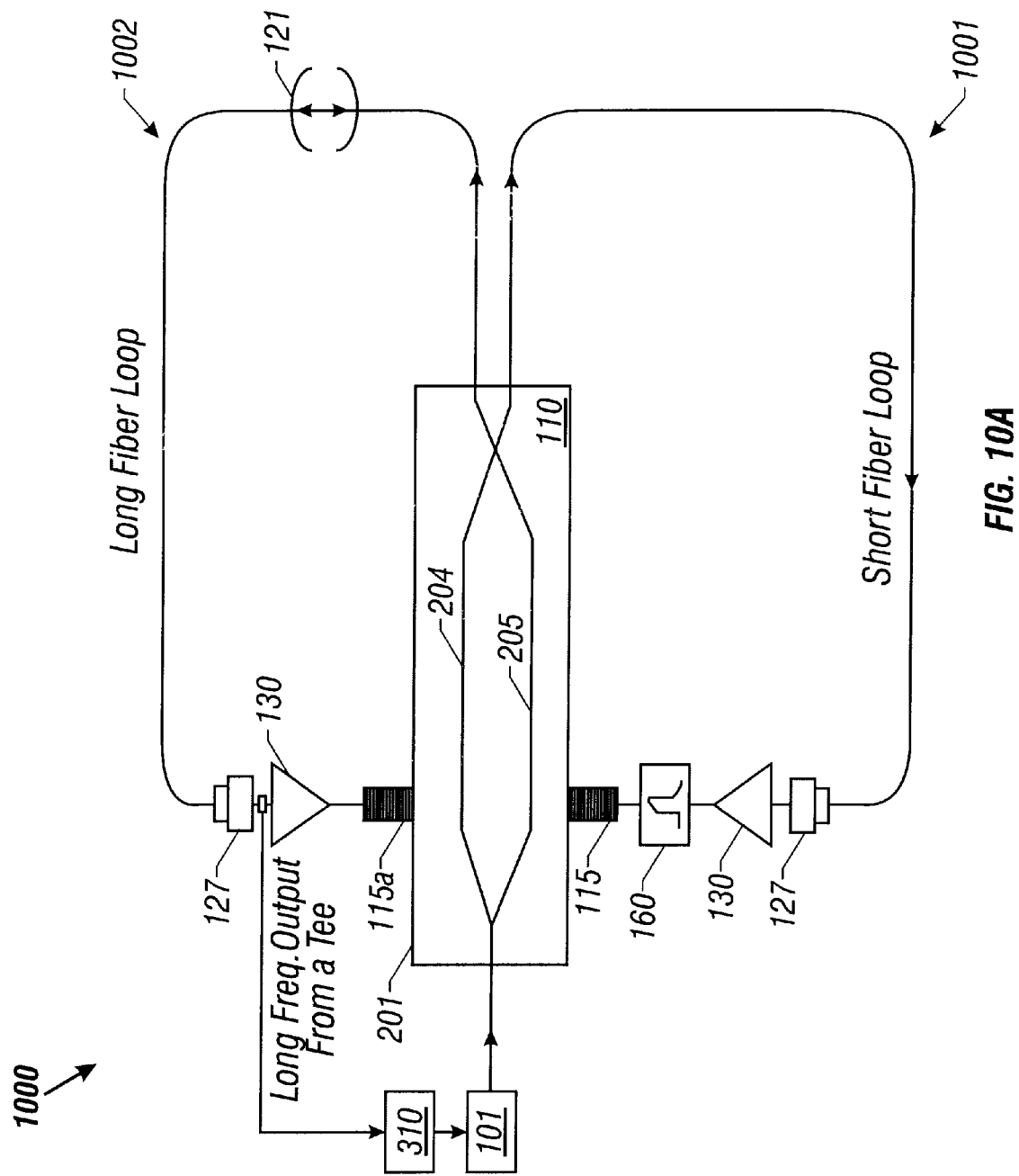
FIGS. 10A and 10B show two examples of dual-loop opto-electronic oscillators having an optical resonator according to the invention.
Figure 10B:
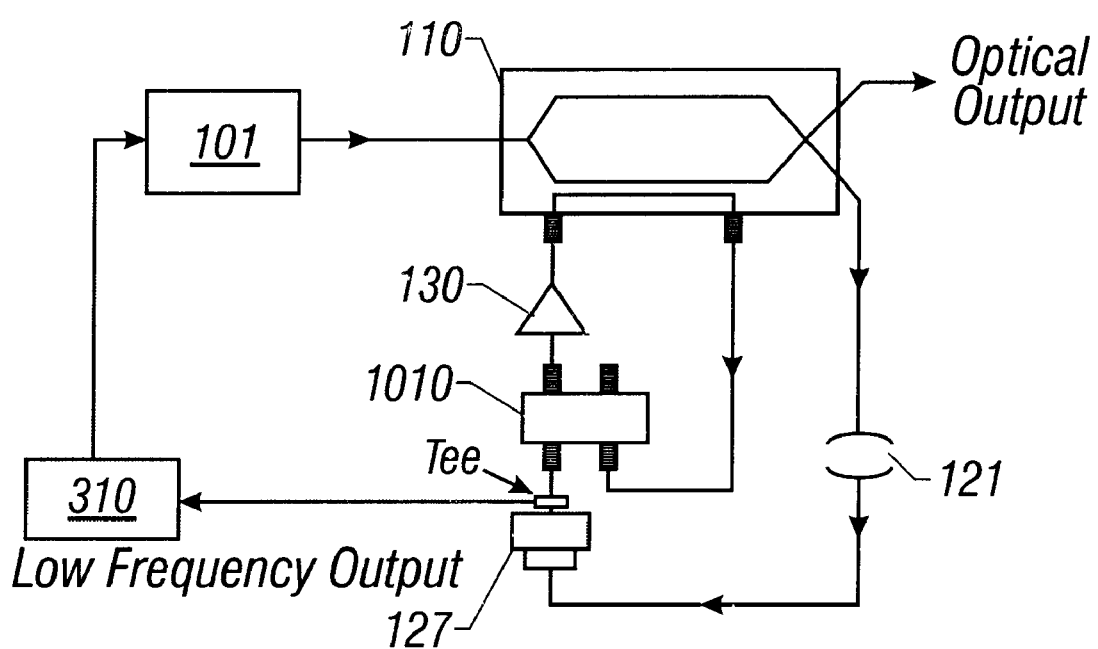

FIGS. 10A and 10B show two examples of dual-loop OEOs having an optical resonator 121. The OEO in FIG. 10A has two opto-electronic loops 1001 and 1002 that respectively drive two electrical ports on the EO modulator 110 to control the optical modulation. The optical resonator 121 is placed in the longer loop 1002. A RF signal splitter, such as a biased Tee, can be coupled between the detector 127 and the amplifier 130 to transmit high frequency signal component to the modulator 110 and to direct low frequency component to the frequency control circuit 310 which responds to this input to control the laser 101. Other configurations of implementing the circuit 310 are also possible in view the previous description.

FIG. 10B shows a dual-loop OEO with one electrical loop and one opto-electronic loop. An electrical signal combiner 1010 is used to combine the electrical signals of the two loops to produce a sum signal to drive a single port in the EO modulator 110. In general, a signal combiner can used in this manner to combine the electrical signals from two or more loops together. Similar to the system in FIG. 10A, the frequency control circuit 310 here receives its input from a low frequency output of a biased Tee coupled between the detector 127 and the coupler 1010 to control the laser 101.

Brillouin Opto-electronic oscillators use at least one active opto-electronic feedback loop that generates an electrical modulation signal based on the stimulated Brillouin scattering in a Brillouin optical medium-in the loop. See, e.g., U.S. Pat. No. 5,917,179 to Yao, which is incorporated by reference in its entirety. An optical pump laser beam is injected into the Brillouin optical medium to produce an acoustic grating moving in the direction of the pump laser beam due to the electrorestrictive effect. The grating interacts with the pump laser beam to produce a backscattered Brillouin scattering signal at a frequency $v_B$ less than that of the pump laser beam, by a Doppler shift $v_D$, i.e., $v_B = v_P - v_D$. The Brillouin scattering signal is converted into an electrical modulation signal by a photodetector in the opto-electronic feedback loop.

Figure 11:
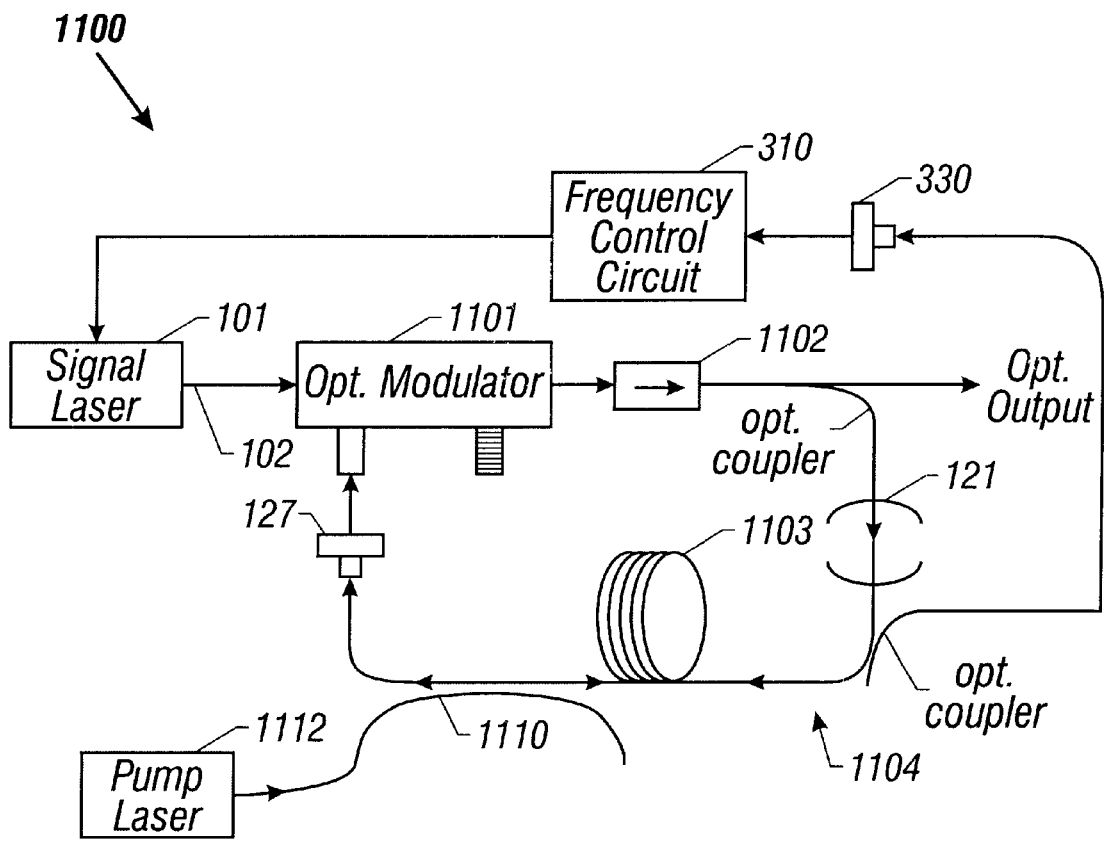
FIG. 11 shows a Brillouin opto-electronic oscillator implementing an optical resonator and a frequency control circuit according to one embodiment of the invention.

FIG. 11 shows a Brillouin OEO implementing an optical resonator 121 and a frequency control circuit 310 according to one embodiment of the invention. The EO modulator 1101 uses the electrical modulation signal of the feedback loop 1104 to modulate an optical carrier produce by a laser 101 to generate a modulated optical carrier signal which is modulated at an oscillation frequency $f_{osc}=|v_B-v_S|=|v_P-v_S-v_D|$. The Brillouin medium is a segment of optical fiber 1103 in the loop 1104. The pump laser 1112 is coupled into the fiber 1103 by a coupler 1110 in an opposite direction to the direction of the modulated optical carrier coupled into the loop 1104. The Brillouin scattering signal is in the direction of the optical carrier signal. The photodetector 127 receives the Brillouin scattering signal and the optical carrier signal to produce the electrical modulation signal. The frequency control circuit 310 is coupled to receive an electrical signal converted from a portion of the optical transmission of the resonator 121.

Figure 12:
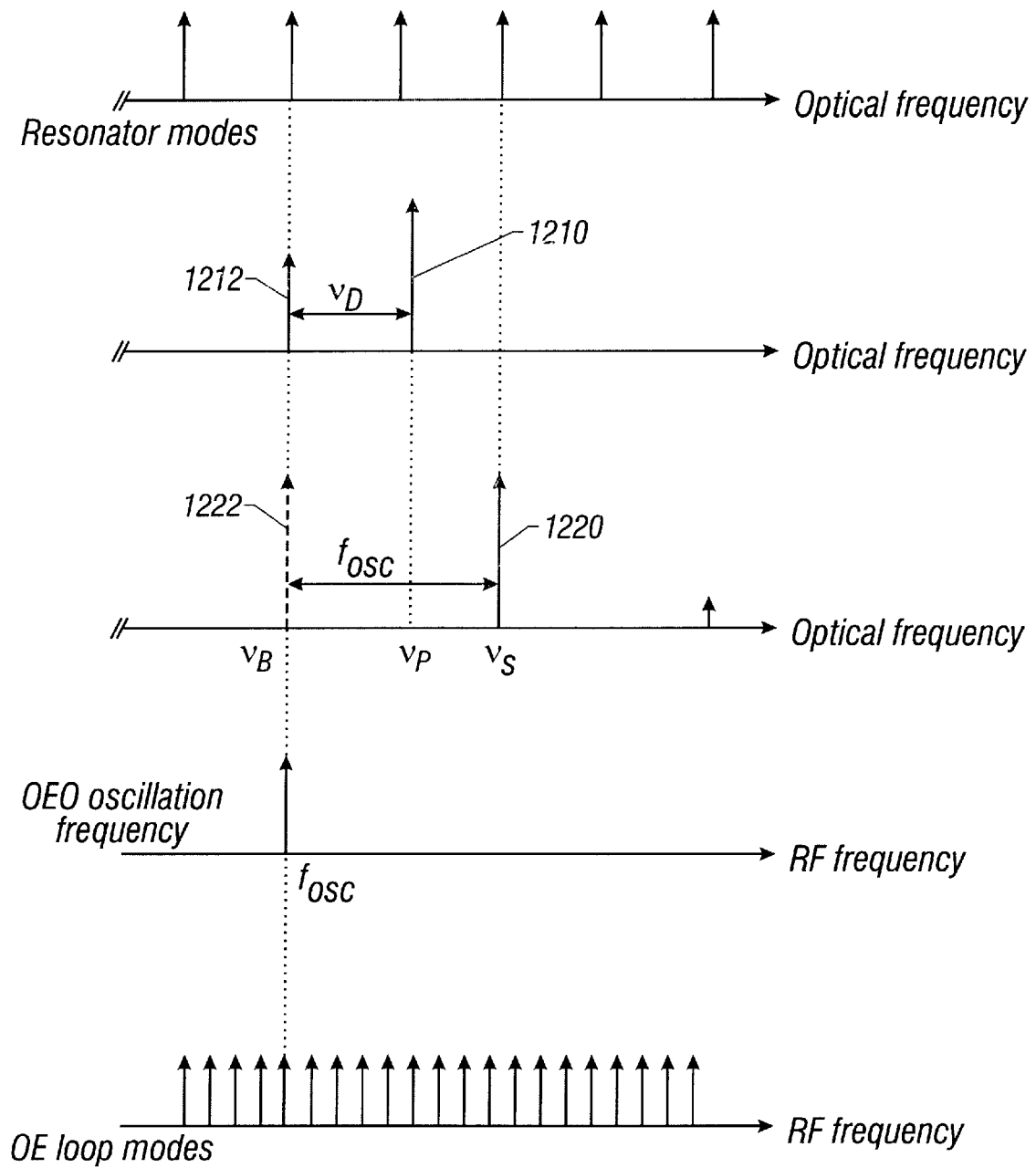
FIG. 12 shows the mode matching conditions of the Brillouin opto-electronic oscillator shown in FIG. 11.

FIG. 12 shows the mode matching conditions of the Brillouin OEO 1100. In addition to the mode matching conditions stated in FIGS. 2B–2D, the following mode matching condition must be satisfied:

$$f_{osc}=|v_B-v_S|=|v_P-v_S-v_D|=J \cdot FSR_r$$

where J is an integer. Hence, the oscillation frequency $f_{osc}$ is tunable by adjusting either the frequency $v_P$ of the pump laser 1112 or the frequency $v_S$ of the signal laser 101, or both.

Figure 13:
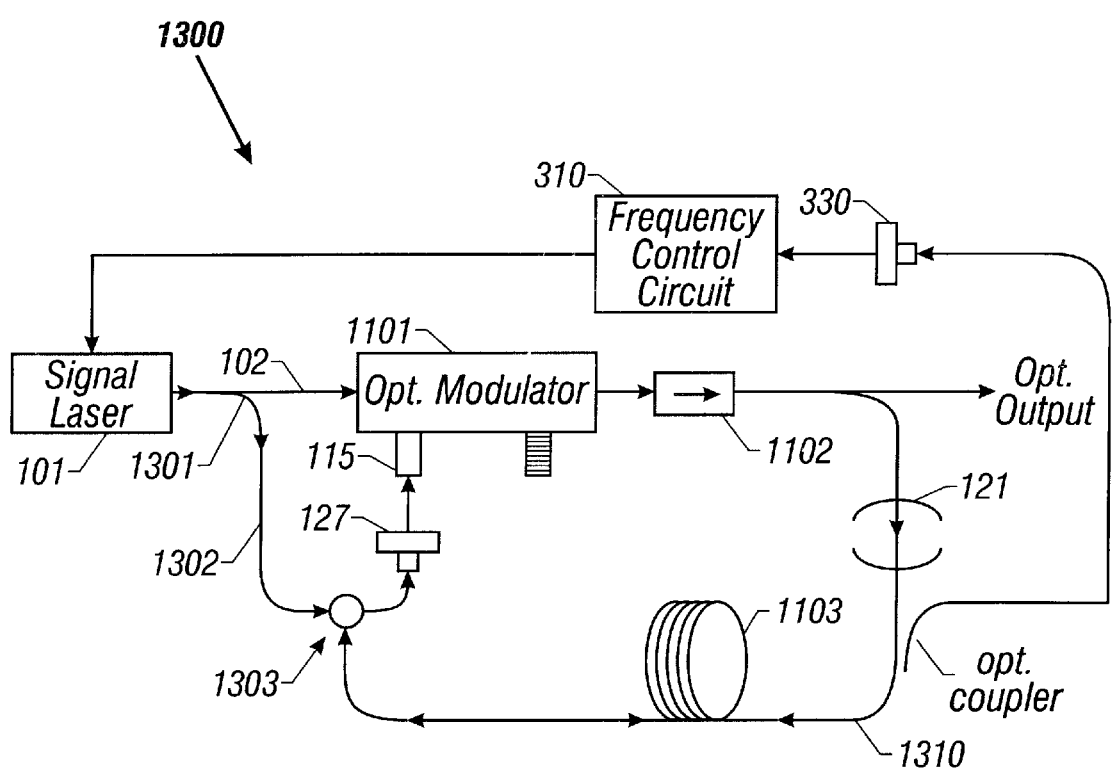
FIG. 13 shows a Brillouin opto-electronic oscillator that uses a single laser to produce both the pump laser and the signal laser.

The Brillouin OEO 1100 uses two separate lasers 101 and 1112. This requires that the frequencies of the two lasers be relatively stable with respect to each other. FIG. 13 shows a Brillouin OEO 1300 that uses a single laser to produce both the pump laser, and the signal laser. An optical circulator 1303 is used to couple a portion of the output of the laser into the loop 1310 as the pump beam. The additional mode matching due to the Brillouin effect is modified to $f_{osc}=v_D=J \cdot FSR_r$. Hence, the oscillation frequency $f_{osc}$ is determined by Doppler shift and is in general not tunable.

Figure 14:
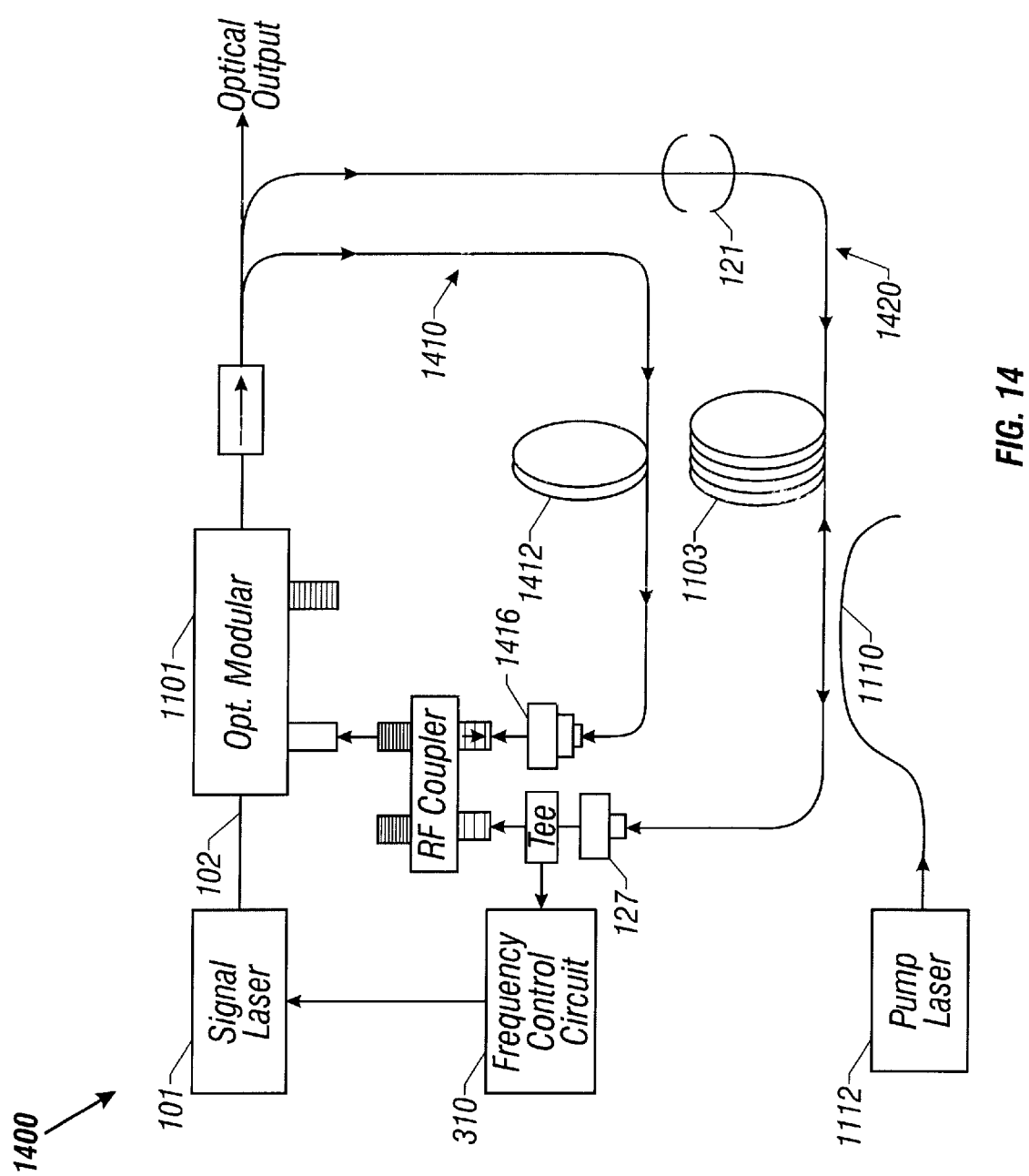
FIG. 14 shows an exemplary dual-loop Brillouin opto-electronic oscillator having a Brillouin opto-electronic loop and a non-Brillouin opto-electronic loop.

One or more auxiliary feedback loops may be implemented in addition to the Brillouin opto-electronic feedback loop to form a multi-loop Brillouin OEO. An auxiliary feedback loop may be of any type, including an electrical feedback loop, an optical loop, a non-Brillouin opto-electronic loop, or another Brillouin opto-electronic loop. Each loop may have an open loop gain smaller than unity and is still capable of sustaining an oscillation as long as the total open loop gain of all loops is greater than unity. FIG. 14 shows an exemplary dual-loop Brillouin OEO 1400 having a Brillouin opto-electronic loop 1420 and a non-Brillouin opto-electronic loop 1410. Similar to the system in FIG. 10A, a bias Tee is coupled at the output of the detector 127 to send a low frequency component to the frequency control circuit 310.

Another type of OEOs is coupled opto-electronic oscillators ("COEOs"). See, e.g., U.S. Pat. No. 5,929,430 to Yao and Maleki, which is incorporated by reference in its entirety. Such a COEO directly couples a laser oscillation in an optical feedback loop to an electrical oscillation in an opto-electronic feedback loop. The laser oscillation and the electrical oscillation are correlated with each other so that both the modes and stability of one oscillation are coupled with those of the other oscillation. The optical feedback loop includes a gain medium to produce a loop gain greater than unity to effectuate the laser oscillation. This optical loop may be a Fabry-Perot resonator, a ring resonator, other resonator configurations. The open loop gain in the opto-electronic loop also exceeds the loss to sustain the electrical oscillation. The coupling between two feedback loops is achieved by controlling the loop gain of the optical loop by an electrical signal generated by the opto-electronic feedback loop. COEOs can achieve a single-mode RF oscillation without a RF bandpass filter or any additional opto-electronic feedback loops. A multi-mode laser can be used.

In comparison with other exemplary OEOs described above, an optical resonator can be placed in either an opto-electronic feedback loop or in the optical feedback loop of a COEO. The former configuration requires locking the frequencies of the laser modes to the transmission peaks of the resonator by using a frequency control circuit. Alternatively, two optical resonators may be respectively placed in the optical loop and the opto-electronic loop at the same time.

Figure 15B:
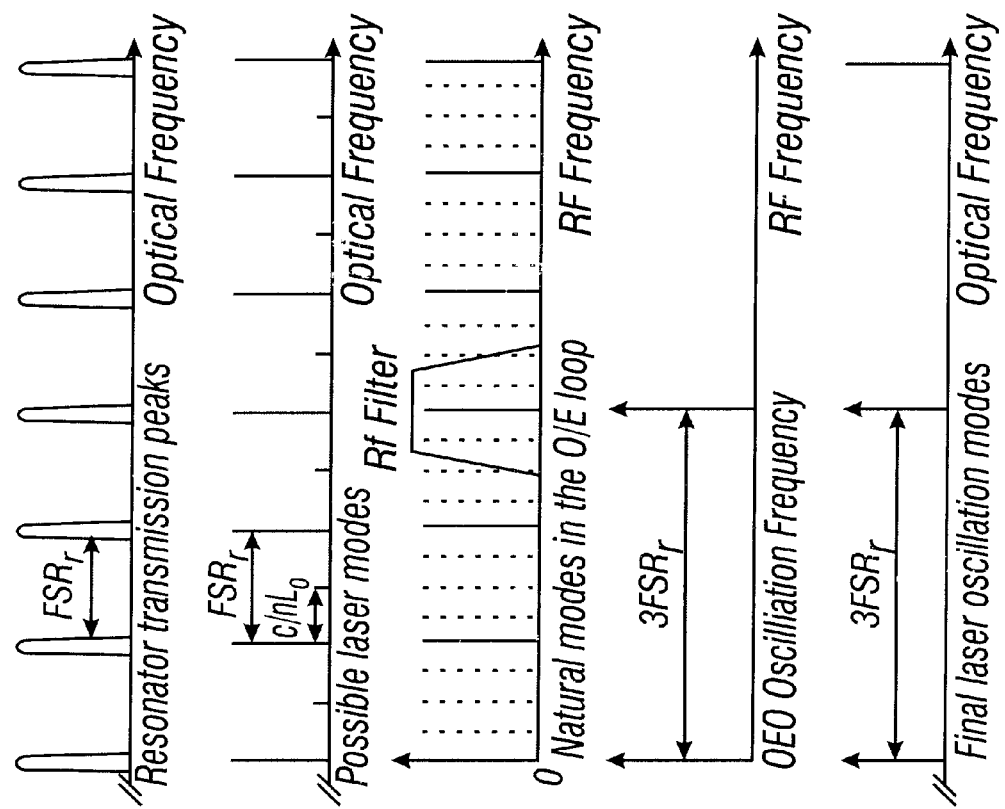
FIG. 15B illustrate the spectral relationships of the resonator transmission, the laser modes, the opto-electronic oscillation modes, and the RF filter's center frequency and bandwidth in the device in FIG. 15A.
Figure 15A:
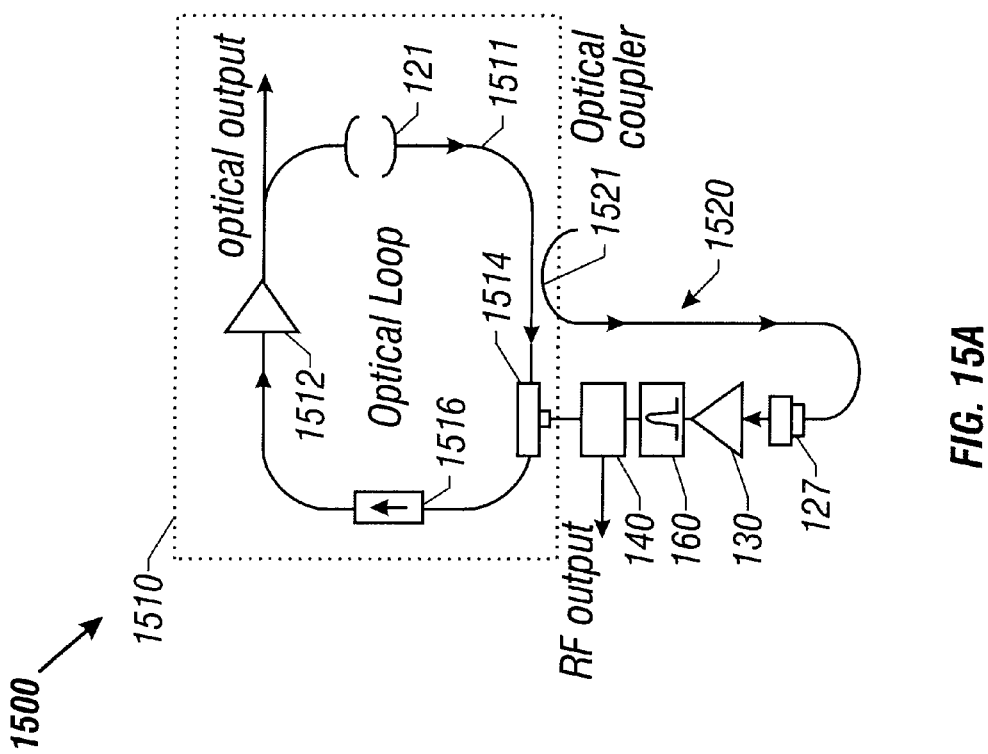
FIG. 15A shows one embodiment of a coupled opto-electronic oscillator having an optical feedback loop and an opto-electronic loop.

FIG. 15A shows one embodiment of a COEO 1500 having an optical feedback loop 1510 and an opto-electronic loop 1520. An optical resonator 121 is placed in the optical loop 1510. The optical loop 1510 is shown to be a ring laser that includes an optical amplifier 1512 and an EO modulator 1514. An optical isolator 1516 may be used to ensure the optical wave in the loop 1510 is unidirectional. The ring may be formed by optical fiber 1511 or other optical waveguides. The optical amplifier 1512 and the EO modulator 1514 in combination effectuate a laser gain medium whose gain can be controlled and modulated by an electrical control signal from the opto-electronic loop 1520. A semiconductor optical amplifier, for example, can be used to function as the combination of the amplifier 1512 and the modulator 1514.

One of the advantages of placing the optical resonator 121 in the optical loop 1510 is that the optical modes inside the optical loop 1510 are controlled by the modes of the resonator 121, i.e., only the modes of the loop 1510 that overlap with the modes of the resonator 121 can have enough gain to oscillate. Therefore, the optical frequencies of the laser are automatically aligned with the transmission peaks of the resonator 121. This configuration eliminates the need to lock the optical loop 1510 and the resonator 121 relative to each other in other OEOs with an optical resonator. In addition, the resonator 121 inside the optical loop 1510 determines the quality of both the optical signal generated in the optical loop 1510 and the RF signal generated in the opto-electronic loop 1520. This is because both signals share the very same energy storage element, the resonator 121. For a fiber amplifier based COEO, high-Q optical resonators constructed with optical fiber are preferred, including the fiber Fabry-Perot resonator in FIG. 6 and the fiber ring resonator in FIG. 7.

FIG. 15B illustrate the spectral relationships of the resonator transmission, the laser modes, the opto-electronic oscillation modes, and the RF filter's center frequency and bandwidth. Because the cavity length of the optical loop 1510 includes the contribution of the resonator length, its mode spacing is generally smaller than the FSR of the resonator 121. Consequently, only those of the laser modes that coincide with the transmission peaks of the resonator 121 can oscillate.

The opto-electronic feedback loop 1520 is generally much longer than the cavity length of the laser 1510 and hence a corresponding mode spacing is smaller than the mode spacing of the ring laser 1510. The center frequency of the RF bandpass filter 160 is chosen to be equal to a RF beat frequency of different modes of the ring laser 1510. The bandwidth of the filter 160 is chosen to be narrower than the spacing of the mode beat frequencies (equivalent to FSR of the resonator 121). Within the pass band, many OEO modes compete to oscillate. However, the winner is the mode with a frequency closest to a beat frequency of the laser's longitudinal modes, since only this OEO mode can get energy from the laser 1510. This mode is fed back to modulate the gain of the ring laser 1510, and it effectively mode-locks the ring laser. The mode-locking makes the mode spacing of the laser equal to the frequency of the oscillating OEO mode, which is a multiple of the FSR of the resonator.

Because all the oscillating modes in the mode-locked laser 1510 are forced to be in phase, all the mode beat signals between any two neighboring laser modes thus add up in phase and generate a strong signal at the frequency of the oscillating OEO mode. This enhanced mode beat signal in turn provides more gain to the oscillating OEO mode and reinforces its oscillation.

Therefore, the conditions for oscillation are:
(1) the total length of the optical loop 1510 (laser cavity) is the multiple of the cavity length of the resonator 121 (or the free spectral range of the resonator 121 is multiple of laser's mode spacing);
(2) the length of the opto-electronic loop 1520 is the multiple of the resonator's cavity length (or the free spectral range of the resonator is the multiple of opto-electronic loop's mode spacing);
(3) the center frequency of the RF filter 160 is the multiple of the free spectral range of the resonator 121; and
(4) the bandwidth of the RF filter 160 is less than the FSR of the resonator 121.

Figure 15C:
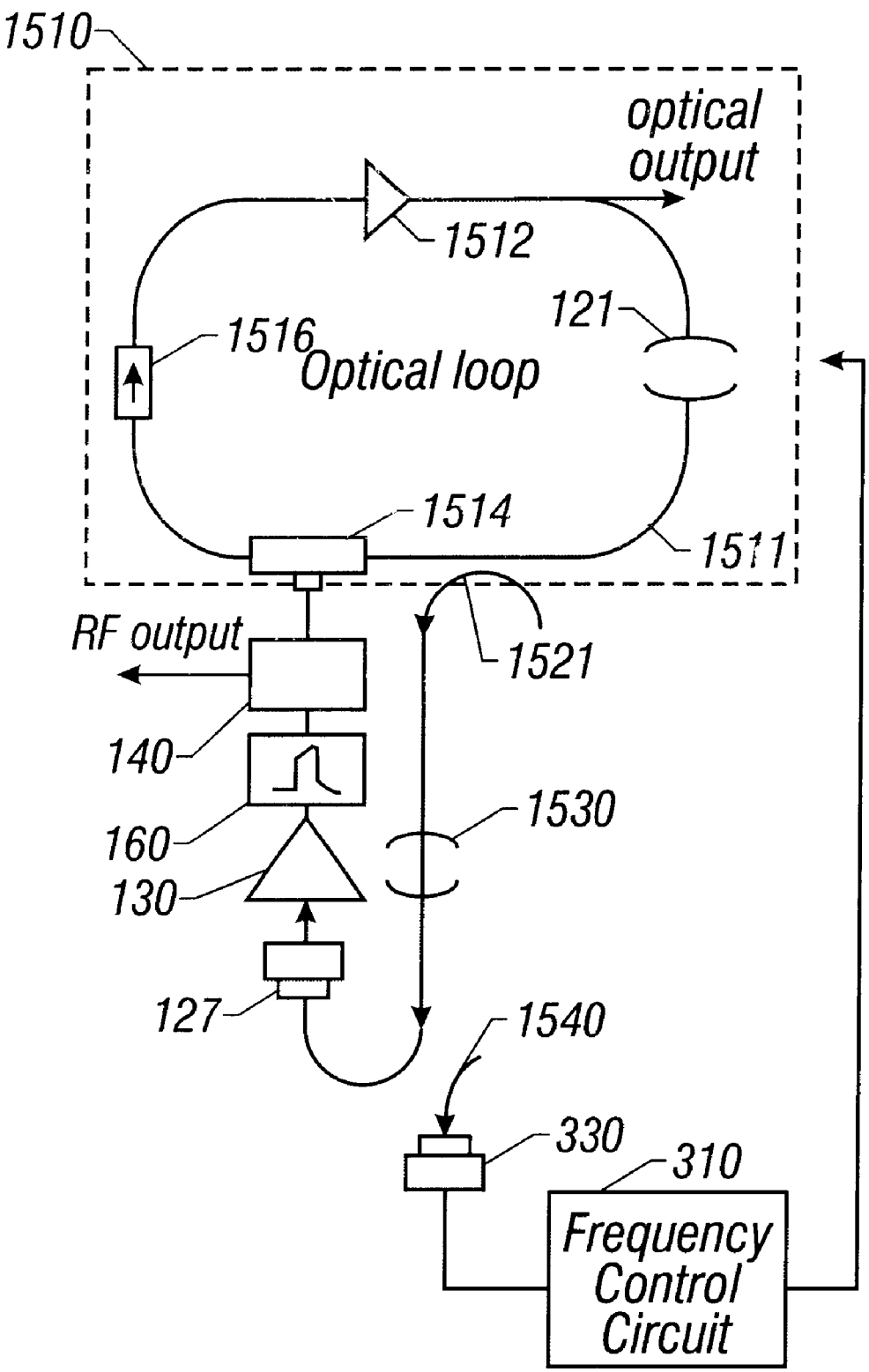
FIG. 15C shows a coupled opto-electronic oscillator having two optical resonators based on the system in FIG. 15A.

FIG. 15C shows a COEO having two optical resonators based on the system in FIG. 15A. A frequency control circuit 310 is used to lock the modes of the optical resonator 1530 in the opto-electronic loop 1520 relative to the modes of the optical loop 1510. In this example, the control can be achieved by controlling the total cavity length of the optical loop. 1510. In addition to the above mode matching conditions, the mode spacing of the optical resonator 1530 must be a multiple of the laser modes and the modes of the resonator 1530 and the modes of the resonator 121 must have some overlapped modes.

Figure 16:
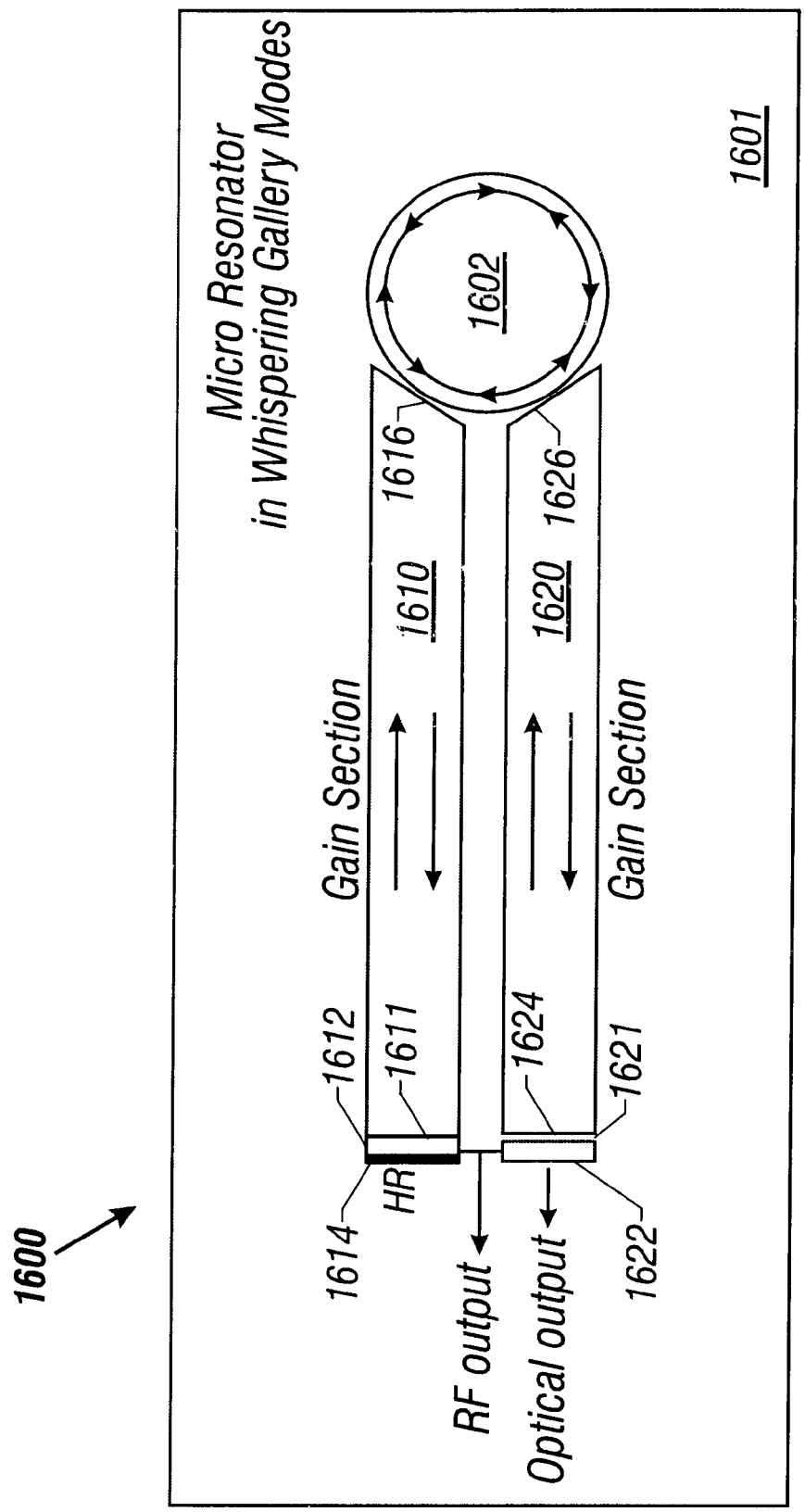
FIG. 16 shows an embodiment of an integrated coupled opto-electronic oscillator based on a micro cavity in whispering gallery modes.

FIG. 16 shows an embodiment of a COEO-on-chip 1600 based on a micro cavity in whispering gallery modes. This device is formed on a semiconductor substrate 1601 and includes two waveguides 1610 and 1620 that are coupled to a high Q micro cavity 1602 such as a microsphere as shown. The waveguides 1610 and 1620 have angled ends 1616 and 1626, respectively, to couple to the micro cavity 1602 by evanescent coupling. The other end of the waveguide 1610 includes an electrical insulator layer 1611, an electro-absorption modulator section 1612, and a high reflector 1614. This high reflector 1614 operates to induce pulse colliding in the modulator 1612 and thus enhance the mode-locking capability. The other end of the waveguide 1620 is a polished surface 1624 and is spaced from a photodetector 1622 by a gap 1621. The surface 1624 acts as a partial mirror to reflect a portion of light back into the waveguide 1620 and to transmit the remaining portion to the photodetector 1622 to produce an optical output and an electrical signal. An electrical link 1630 is coupled between the modulator 1612 and photodetector 1622 to produce an electrical output and to feed the signal and to feed the electrical signal to control the modulator 1612.

Hence, two coupled feedback loops are formed in the device 1600. An optical loop is in the form of a Fabry-Perot resonator configuration, which is formed between the high reflector 1614 and the surface 1624 of the waveguide 1620 through the modulator 1612, the waveguide 1610, the micro cavity 1602, and the waveguide 1620. The gap 1621, the detector 1622, and the electrical link 1630 forms another opto-electronic loop that is coupled to the optical loop. Hence, the configuration of the COEO 1600 is similar to the configuration uses in the COEO 1500 in FIG. 15A. Therefore, the same mode matching conditions apply.

The waveguides 1610 and 1620 are active and doped to also function as the gain medium so that the optical loop operates as a laser when activated by a driving current. This current can be injected from proper electrical contacts coupled to an electrical source. The gain of the laser is modulated electrically by the modulator 1612 in response to the electrical signal from the photodetector 1622.

The photodetector 1622 can be structurally identical to the electro-absorption modulator 1612 but is specially biased to operate as a photodetector. Hence, the photodetector 1622 and the modulator 1612 have a similar impedance, e.g., on the order of a few kilo ohms, and thus are essentially impedance matched. Taking typical values of 2 volts modulator switching voltage, 1 kilo ohm for the impedance of the modulator 1612 and photodetector 1622, the optical power required for the sustained RF oscillation is.estimated at about 1.28 mW when the detector responsivity is 0.5 A/W. Such an optical power is easily attainable in semiconductor lasers. Therefore, under the impedance matching condition, a RF amplifier can be eliminated in the electrical link 1630 as in the integrated OEO 900 in FIG. 9.

The two waveguides 1610 and 1620 may be positioned adjacent and parallel to each other on the substrate 1601 so that the photodetector 1622 and the modulator 1612 are close to each other. This arrangement facilitates wire bonding or other connection means between the photodetector 1622 and the modulator 1612.

Although only a few embodiments are described, various modifications and enhancements may be made without departing from the following claims.

What is claimed is:

1. An opto-electronic device, comprising:
   an optical modulator, having an electrical input port to accept an electrical modulation signal and an optical input port to receive an input optical carrier signal at an optical carrier frequency, to generate an output optical carrier signal which is modulated at an oscillation frequency related to said electrical modulation signal;
   an opto-electronic loop, having an optical section coupled to receive at least a portion of said output optical carrier signal and an electrical section coupled to said electrical input port to produce said electrical modulation signal, said opto-electronic loop causing a delay in said electrical modulation signal to provide a positive feedback to said optical modulator; and
   an optical resonator, coupled in said optical section of said opto-electronic loop,
   wherein said optical resonator has a free spectral range that is greater than a mode spacing of said opto-electronic loop by a first integer factor, less than said optical carrier frequency by a second integer factor, and less than said oscillation frequency by a third integer factor.

2. A device as in claim 1, wherein said optical modulator and said opto-electronic loop forms a closed loop which has a total loop gain that exceeds a total is loop loss.

3. A device as in claim 1, further comprising a frequency control circuit, coupled to one of said optical modulator and said opto-electronic loop to receive a signal indicative of a difference between a mode frequency of said optical resonator and said optical carrier frequency, to produce a control signal that causes said difference to be less.than a tolerance range.

4. A device as in claim 3, said frequency control circuit is coupled to adjust a cavity length of said optical resonator to maintain said mode frequency relative to said optical carrier frequency.

5. A device as in claim 3, further comprising a laser to produce said output optical carrier signal, said laser coupled to said frequency control circuit to adjust and maintain said optical carrier frequency relative to said mode frequency.

6. A device as in claim 1, wherein said optical resonator includes a Fabry-Perot resonator.

7. A device as in claim 6, wherein said Fabry-Perot resonator includes a segment of optical fiber.

8. A device as in claim 1, wherein said optical resonator includes a ring cavity.

9. A device as in claim 8, wherein said ring cavity is formed of a fiber ring.

10. A device as in claim 1, wherein said optical resonator includes a resonator in whispering gallery modes.

11. A device as in claim 10, wherein said resonator includes a dielectric sphere.

12. A device as in claim 10, further comprising two optical couplers connected in said optical section to couple optical energy to and from said resonator via evanescent coupling.

13. A device as in claim 1, wherein said opto-electronic loop includes a photodetector connected between said optical and electrical sections.

14. A device as in claim 13, wherein said opto-electronic loop includes an electronic bandpass filter in said electrical section.

15. A device as in claim 13, wherein said opto-electronic loop includes an electrical signal amplifier in said electrical section.

16. A device as in claim 13, wherein said photodetector and said optical modulator have a substantially matched impedance.

17. A device as in claim 13, wherein said electrical section does not have a signal amplifier between said photodetector and said optical modulator.

18. A device as in claim 1, further comprising at least one additional feedback loop coupled to produce an additional electrical modulation signal to affect optical modulation in said optical modulator in response to an output signal from said optical modulator, wherein said additional feedback loop has a delay different from said delay in said opto-electronic loop.

19. A device as in claim 18, wherein said additional feedback loop is an opto-electronic loop.

20. A device as in claim 18, wherein said additional feedback loop is an electrical loop which causes a delay in an electrical signal associated with said optical modulator.

21. A device as in claim 20, wherein at least one of said opto-electronic loop and said additional feedback loop has a loop gain less than a respective loop loss.

22. A device as in claim 18, wherein said opto-electronic loop and said additional feedback loop have a total loop gain greater than a total loop loss.

23. A device as in claim 1, further comprising a substrate, and wherein said optical modulator, said opto-electronic loop, and said optical resonator are integrated on said substrate.

24. A device as in claim 1, further comprising a laser resonator to produce a laser oscillation, said laser resonator enclosing said optical modulator in an optical path of said laser oscillation within said laser resonator, wherein said laser oscillation is in one of modes of said optical resonator that overlaps with a mode of said laser resonator.

25. A device as in claim 24, wherein said laser resonator is a ring resonator.

26. A device as in claim 25, wherein said optical modulator includes a semiconductor optical-absorber.

27. A device as in claim 24, wherein said laser resonator is a Fabry-Perot resonator.

28. A device as in claim 24, wherein said optical resonator is located within said laser resonator.

29. A device as in claim 28, wherein said optical resonator includes a resonator in whispering gallery modes.

30. A device as in claim 29, wherein said resonator in whispering gallery modes includes a dielectric sphere.

31. A device as in claim 1, wherein said optical section of said opto-electronic loop includes an optical medium of a type that produces a Brillouin scattering signal in a direction of said output optical carrier signal in response to an optical pump signal which propagates in an opposite direction of said optical carrier signal.

32. A device as in claim 31, further including an optical coupling element that couples a portion of said input optical carrier signal to said optical section as said optical pump signal.

33. A device as in claim 31, further including a signal laser that produces said input optical carrier signal and a pump laser that produces said optical pump signal.

34. An opto-electronic device, comprising:
   a laser, having an active optical feedback loop with a first loop gain greater than unity which changes in response to an electrical modulation signal; and
   an opto-electronic feedback loop coupled to said active optical feedback loop to produce said electrical modulation signal in response to a laser output from said laser,
   wherein said opto-electronic feedback loop comprises:
      an optical resonator coupled to receive a portion of said laser output from said-laser, and
      a photodetector coupled to covert an optical output from said optical resonator into an electrical signal.

35. A device as in claim 34, further comprising a device coupled to said laser to maintain a laser frequency at a frequency of a transmission peak of said optical resonator.

36. A device as in claim 34, further comprising a device coupled to said optical resonator to maintain a frequency of a transmission peak of said optical resonator at a laser frequency of said laser.

37. A device as in claim 34, further comprising a second optical resonator located within said active optical feedback-loop of said laser.

* * * * *